United States Patent [19]

Kushima et al.

[11] Patent Number: 4,562,637

[45] Date of Patent: Jan. 7, 1986

[54] METHOD OF MANUFACTURING SOLAR BATTERY

[75] Inventors: Tadao Kushima, Ibaraki; Tasao Soga, Hitachi; Takaya Suzuki, Katsuta, all of Japan

[73] Assignee: Hitachi, Ltd., Tokyo, Japan

[21] Appl. No.: 622,584

[22] Filed: Jun. 20, 1984

[30] Foreign Application Priority Data

Jun. 22, 1983 [JP] Japan ............................... 58-110807

[51] Int. Cl.⁴ ............................................. H01L 31/18
[52] U.S. Cl. ................................... 29/572; 29/577 R;
29/581; 29/591; 29/854; 29/860; 29/861;
136/244; 136/251; 228/180.1; 228/180.2;
219/121 LD
[58] Field of Search .................. 29/572, 577 R, 581,
29/589, 591, 854, 860, 861; 136/244, 251, 245;
228/180 R, 180 A; 219/121 LD

[56] References Cited

FOREIGN PATENT DOCUMENTS 2757301  7/1979  Fed. Rep. of Germany ...... 136/244
56-28383  1/1981  Japan ................................... 136/244

*Primary Examiner*—Aaron Weisstuch
*Attorney, Agent, or Firm*—Antonelli, Terry & Wands

[57] ABSTRACT

A method of manufacturing a solar battery by serially connecting a plurality of solar battery elements arranged spaced from each other. A pair of flexible films are used to sandwich the arrangement of the solar battery elements, and each of the flexible films has a plurality of conductive members formed thereon at positions respectively corresponding to the solar battery elements. However, each conductive member has one end portion extended beyond the surface of the corresponding solar battery element in the direction of the alignment of the solar battery elements. Thus, when the pair of flexible films are disposed to sandwich the solar battery elements, the extended end portion of the conductive member on the side of the light receiving surface of one solar battery element is positioned in the space between adjacent solar battery elements opposite the end portion of the conductive member on the side of the back surface of the next solar battery element. By welding both end portions of the conductive members by, for example, a laser beam, the adjacent solar battery elements are successively connected in series.

11 Claims, 7 Drawing Figures

METHOD OF MANUFACTURING SOLAR BATTERY

BACKGROUND OF THE INVENTION

1. Field of the Invention

The present invention relates to a method of manufacturing a solar battery, and more particularly to a method of manufacturing a solar battery which is suitable for sequentially and serially connecting a plurality of solar battery elements by joining a light receiving surface of one solar battery element to a back surface of the next solar battery element by an electrically conductive member.

2. Description of the Prior Art

In the prior art, a method of serially connecting a plurality of solar battery elements is illustrated in FIGS. 1A and 1B. In this method as shown in FIGS. 1A and 1B, the front and back surfaces of each solar battery element 10a, 11b are provided with a eutectic solder deposition layer, or a preliminary eutectic solder layer formed by deposition, or a paste solder layer formed by printing or the like. A conductor lead 16 of an electrically conductive member having a eutectic solder deposition layer or the like formed on the surface beforehand and bent stepwise at the center thereof is disposed to bridge the light receiving surface 12 of a solar battery element 10a and the back surface 14 of another solar battery element 10b. Then, in a furnace of the resistance heating type and in an atmosphere of $H_2$, $N_2$, Ar gas or the like, an electrode pattern 18 of the solar battery element 10a and the conductor lead 16 are welded to each other, and the conductor lead 16 and an electrode pattern 20 of the solar battery element 10b are also welded and thus the connection of the solar battery elements 10a and 10b is completed. In this method, it takes several seconds to several tens of minutes to melt the solder (melting point above 183° C.) contained in the solder deposition layer or the like formed on the surface of the conductor lead 16. Further, since the conductor lead 16 is a single integral member of stepwisely bent structure, automatic feeding of the conductor lead 16 is difficult and thus this method was not suitable for mass production. Furthermore, since the material of the conductor lead 16 is a Fe-Ni alloy (Fe-42Ni), although the thermal expansion coefficient is small, the rigidity is high, and thus there was a problem in that the stress of the conductor lead 16 imparted to the electrode pattern 18 of the light receiving surface 12 after the connection was large and peelings and cracks were caused.

In addition, for the furnace of the resistance heating type used with an atmosphere of $H_2$, $N_2$, Ar gas or the like, a large conveyer furnace is required and hence there was a disadvantage that energy consumption including gas, electric power and the like was large.

Another method of connecting the solar battery elements has been proposed as illustrated in FIG. 2. In this method, solar battery elements 10a and 10b are disposed respectively on corresponding conductors 24 located on a substrate 22, and then a film 28 formed with a conductive pattern 26 of copper foil having solder deposited thereon is placed on the solar battery elements 10a and 10b such that the conductive pattern 26 is in contact with the conductor 24 and with the electrode pattern 30. Then heat and pressure are applied to these portions in contact with each other to effect welding. However, in this method, the heat capacity of the substrate 22 is large, and since a considerable time is needed for the solder to become melted and solidified, it was difficult to serially connect the solar battery elements at high speeds.

SUMMARY OF THE INVENTION

It is the object of the present invention to overcome the drawbacks of the prior art and to provide a method of manufacturing a solar battery in which no peelings or cracks are caused in the electrode of the solar battery element and a plurality of solar battery elements can be serially connected at high speeds.

The present invention to achieve the object mentioned above provides improvements in a method of manufacturing a solar battery in which method a plurality of solar battery elements are arranged with spaces therebetween, each element having a light receiving surface and a back surface respectively formed with electrode patterns, and the light receiving surface of each solar battery element is serially connected by means of an electrically conductive member to the back surface of the solar battery element located adjacent to and on one side of the former solar battery element.

According to the present invention, a pair of flexible members are prepared, in which each of the flexible members has on one surface thereof a plurality of conductive members formed along the direction of arrangement of the solar battery elements and spaced with the same spacing as the solar battery element arrangement, and the pattern of the conductive member in the arrangement direction of the solar battery elements is made wider than the front and back surfaces of the solar battery element. The pair of flexible members is disposed with the arrangement of the solar battery elements interposed therebetween so that the conductive members of each flexible member respectively face the light receiving surfaces or the back surfaces of the solar battery elements, and an end portion of the conductive member on the side of the light receiving surface of each solar battery element is positioned in the space between adjacent solar battery elements such that it is opposite an end portion of the conductive member on the side of the back surface of the solar battery element adjacent to and on one side of the former solar battery element. Then each of the solar battery elements is sandwiched by the pair of flexible members, and further both end portions of the conductive members are brought into close contact with each other by pressing the pair of flexible members from the outside thereof toward the space between the adjacent solar battery elements. A light-heat beam is radiated from the outside towards the light receiving surface side and towards the back surface side of each solar battery element to effect welding of the electrode pattern and the conductive member on the side of the light receiving surface and welding of the electrode pattern and the conductive member on the side of the back surface, which have been brought into contact with each other, and also to effect welding of both end portions of the conductive members which have been brought into contact with each other in the space between the solar battery elements, thereby to connect the solar battery elements in series.

DESCRIPTION OF THE PREFERRED EMBODIMENT

A manufacturing method of a solar battery in one embodiment of the present invention is carried out according to the steps shown in FIGS. 3 to 6.

Figure 1A:
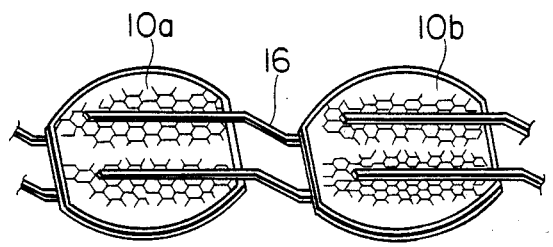
FIGS. 1A and 1B are respectively a perspective view and a cross-sectional view of a portion of a solar battery illustrating a prior art method.
Figure 1B:
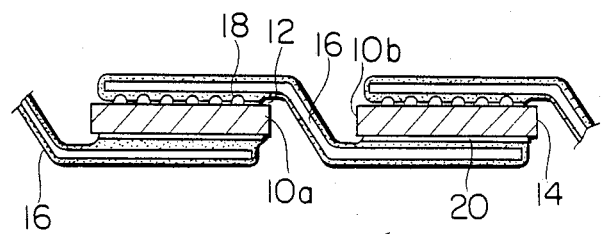
Figure 2:
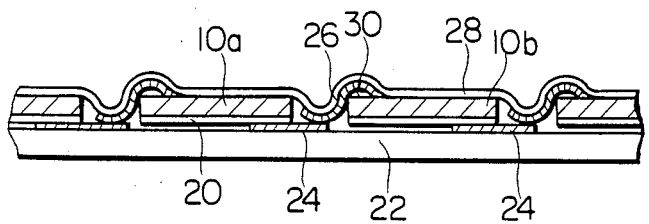
FIG. 2 is a cross-sectional view illustrating another prior art method.
Figure 3:
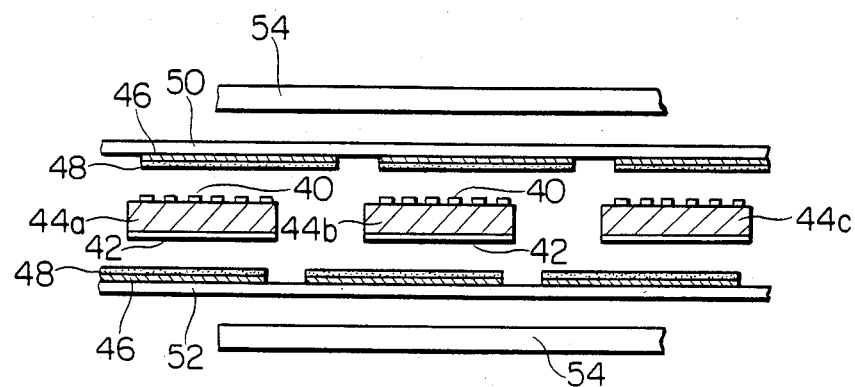
FIGS. 3 to 6 are cross-sectional views illustrating the manufacturing steps of one embodiment of the present invention.

Referring to FIG. 3, solar battery elements 44a, 44b, and 44c are arranged spaced from each other. Each of the solar battery elements 44a, 44b, and 44c has electrode patterns 40 and 42 formed respectively on the light receiving surface and the back surface of the element, and the electrode patterns 40 and 42 are formed with a eutectic solder deposition layer or a eutectic solder layer formed by a dip method or a reflow method, or a paste solder layer formed by a printing method. Then a pair of flexible films 50 and 52 are disposed respectively on both sides of the solar battery elements 44a, 44b, and 44c. Each of the flexible films 50 and 52 is made of a flexible member of a polyester or the like and has a plurality of conductive members formed on one side thereof along the direction of the arrangement of the elements 44a, 44b, and 44c and spaced with the same spacing as the arrangement of the elements 44a, 44b, and 44c. Each of the conductive members consists of a conductive pattern 46 (e.g., copper deposition layer) with a eutectic solder deposition layer 48 formed on the conductive pattern 46, and the pattern of the conductive pattern 46 is made wider than the front and back surfaces of the element in the direction of the arrangement of the elements 44a, 44b, and 44c. For example, the conductive member (46, 48) of the flexible film 50 is extended beyond the corresponding light receiving surface of the element 44a in one direction along the alignment of the elements 44a, 44b, and 44c and thus the extended portion is facing the space between the two adjacent elements 44a and 44b. The conductive members of the other flexible film 52 are also formed in the same way, however, since the flexible film 52 is disposed so that its conductive members face the back surfaces of the respective elements, the direction of extension of the electrode patterns 46 (or conductive members) is opposite to that of the flexible film 50. In disposing the pair of films 50 and 52 on both sides of the solar battery element arrangement, relative positioning of the conductive members of the pair of flexible films 50 and 52 with respect to the elements 44a, 44b, and 44c is determined in the following manner. The conductive members of both flexible films 50 and 52 respectively face the light receiving surfaces 40 and the back surfaces 42 of the elements 44a, 44b, and 44c, and, in addition, one end portion or the extended portion of the conductive member located on the side of the light receiving surface of the element 44a is in an opposed relationship to one end portion or the extended portion of the conductive member located on the side of the back surface 42 of the element 44b which is one of the elements adjacent element 44a. As a result, the extended portion of the conductive member of the flexible film 50 and the extended portion of the conductive member of the other flexible film 52 are in an opposed relationship, thereby interposing therebetween a space between two adjacent elements 44a and 44b.

Figure 4:
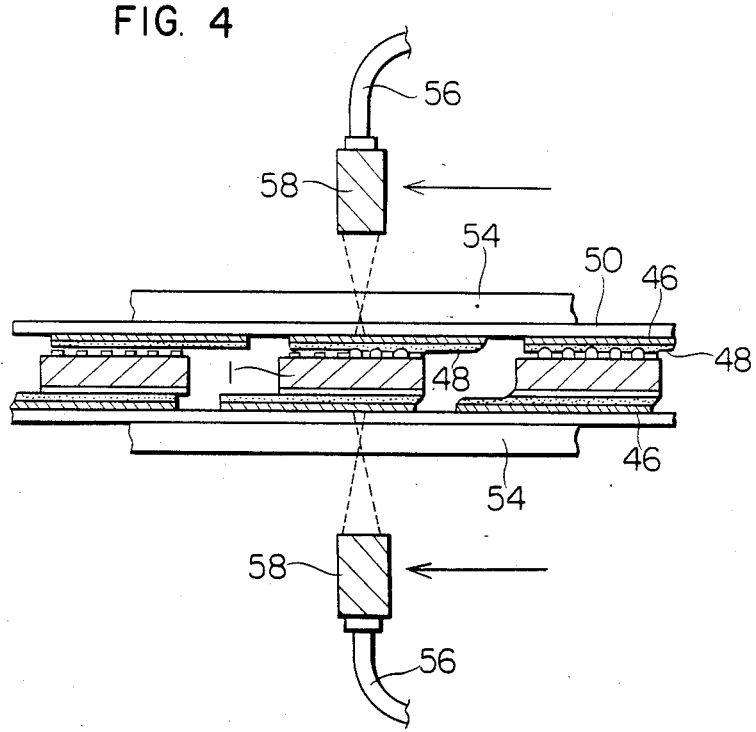

After positioning or registration of the flexible films 50 and 52 with respective to the solar battery elements 44a, 44b, and 44c as described in the foregoing, each of the solar battery elements 44a, 44b, and 44c is sandwiched by the pair of flexible films 50 and 52 by using a pressing structure 54 made of a silica glass material to bring into close contact the electrode pattern 40 and the solder deposition layer 48 on the conductive pattern 46 of the flexible film 50, and the electrode pattern 42 on the solder deposition layer 48 on the conductive pattern 46 of the flexible film 52. This situation is illustrated in FIG. 4.

Referring again to FIG. 4, a light-heat beam such as a YAG laser beam or the like is supplied to a head section 58 from a high energy light-heat generating device (not shown) through a glass fiber 56, and the light-heat beam is focussed by the head section 58 and illuminates the light receiving surface of the solar battery elements 44a, 44b, and 44c. Another head section 58 and glass fiber 56 combination is provided to illuminate the back surface of the solar battery elements 44a, 44b, and 44c. By the illumination of the light-heat beam, the solder deposition layer 48 on the conductive pattern 46 of the flexible film 50 is melted and the electrode pattern 40 and the conductive pattern 46 are joined. Similarly, by the illumination of the back surface of the element, the electrode pattern 42 and the conductive pattern 46 on the flexible film 52 are joined. In this case, the illuminated spot at which the heat is generated is adjusted to be outside the focal point, and it is preferable that the illuminated area does not exceed the lateral width of the flexible films 50 and 52. Furthermore, by moving the head sections 58, 58 at a high speed along the longitudinal direction of the flexible films 50 and 52, or by moving the silica glass pressing structure 54 at a high speed along the longitudinal direction of the flexible films 50 and 52, the welding operation can be performed at high speeds. Further, no temperature rise was perceived in the silica glass pressing structure 54 when it was subjected to the light-heat beam illumination, and it was ascertained that a combination of the YAG laser beam and the silica material is effective.

In addition, by the use of the YAG laser beam as a high energy light-heat source, it is possible to rapidly heat and rapidly cool the solder layer almost instantly and locally, and thus there is no adverse effect on the periphery portions due to the heating and satisfactory welding can be achieved.

Figure 5:
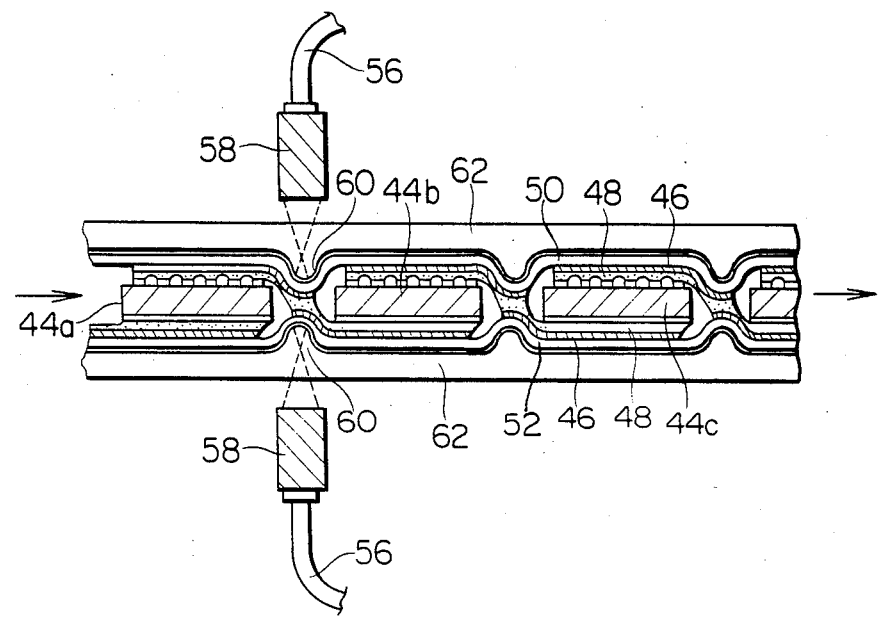
Figure 6:
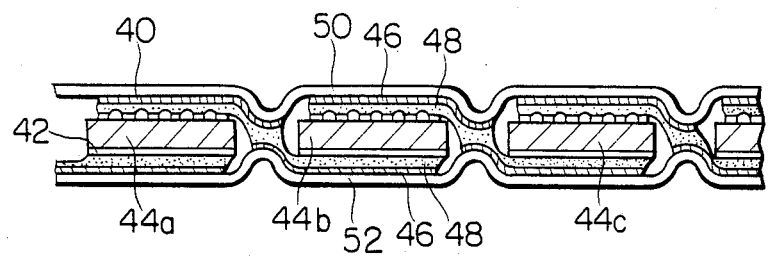

Next, as illustrated in FIG. 5, a silica pressing structure 62 which is provided with projected portions 60 at positions corresponding to the spaces between the solar battery elements 44a, 44b, and 44c is used to press the flexible films 50 and 52 from the outside thereof inwardly towards the spaces between the solar battery elements 44a, 44b, and 44c. As a result, one end portion or the extended portion of the conductive member on the side of the light receiving surface of each solar battery element is brought into close contact with one end portion or the extended portion of the conductive member on the side of the back surface of one of adjacent solar battery elements. Then, the light-heat beam is radiated from the head section 58 through the silica pressing structure 62 to the space portions between the solar battery elements sequentially at a high speed to weld both end portions or both extended portions of the conductive members. Consequently, as shown in FIG. 6, the light receiving surface of each solar battery element and the back surface of an adjacent solar battery elements are connected by means of the conductive members serially. And this series connection of the solar battery elements can be manufactured at high speeds.

In the embodiment described in the foregoing, although the welding of the electrode portions (the electrode patterns 40, 42 of the element and the conductive patterns 46, 46 of the flexible films 50, 52) and the welding of the connecting portions between the elements (the conductive member on the light receiving surface side of one element and the conductive member of the back surface side of the next element) are performed separately, it is also possible to perform the welding of the electrode portions and the connecting portions between the elements almost simultaneously by moving the head section 58 at a high speed.

According to the embodiment described in the foregoing, the following advantages can be obtained.

(a) The connection between the electrode patterns 40, 42 of each solar battery element 44a, 44b, 44c and the corresponding flexible films 50, 52, and the connection between conductive members for connecting the solar battery elements can be performed at high speeds without causing any adverse effects due to heat on the periphery of the electrode patterns 40, 42, because the solder layers for these connections can be rapidly heated and rapidly cooled and solidified almost instantly and locally.

(b) Since the flexible films 50 and 52 are used, the structure is not too rigid and hence during the process of the connection the strain of the electrode patterns 40 and 42 is small, and no peeling or cracking is caused.

(c) The conductive members formed on the flexible film can be fed to the front and back surfaces of each of the solar battery elements successively, and the conductive members can be welded at high speeds. Thus, the mass production of the solar battery can be improved to a great extent.

(d) Atmosphere gas and electric power for a large furnace are not required, and thus manufacturing costs can be reduced.

As described in the foregoing, in the present invention, a plurality of solar battery elements can be serially connected at a high speed without degrading the quality of the elements.

We claim:

1. In a method of manufacturing a solar battery in which a plurality of solar battery elements each having a light receiving surface and a back surface respectively formed with electrode patterns are arranged with a space therebetween, and the light receiving surface of each solar battery element is serially connected by means of a conductive member to the back surface of the preceding solar battery element which is located adjacent to said each solar battery element, the improvement comprising the steps of:

preparing a pair of flexible members, each of the flexible members having a plurality of conductive members formed along the direction of arrangement of said solar battery elements and spaced with substantially the same spacing as the solar battery element arrangement, each of said conductive members having a pattern wider in the direction of the solar battery element arrangement than the light receiving and back surfaces of the respective solar battery element;

disposing said pair of flexible members respectively on both sides of the solar battery element arrangement so that said conductive members of one of said flexible members respectively face the light receiving surfaces of said solar battery elements and said conductive members of the other of said flexible members respectively face the back surfaces of said solar battery elements, and that one end portion of said conductive member on the side of the light receiving surface of each solar battery element is positioned in the space adjacent said each solar battery element, and one end portion of said conductive member on the side of the back surface of the preceding solar battery element adjacent to said each solar battery element is positioned opposed to said one end portion of said conductive member on the side of the light receiving surface through the same space as said space adjacent said each solar battery element;

sandwiching each of said solar battery elements by said pair of flexible members, and pressing said pair of flexible members from the outside thereof at the entire portion thereof including a portion located at the space between adjacent solar battery elements by means of a pressing structure having projected portions each respectively located at a position corresponding to the space between adjacent solar battery elements to bring both said end portions of said conductive members into close contact with each other;

applying a light-heat beam respectively towards the light receiving surface side and towards the back surface side of each of said solar battery elements to weld together each of said electrode patterns and each of said conductive members, and to weld together both said end portions of said conductive members which have been in close contact with each other in the space adjacent said each solar battery element thereby to connect said solar battery elements in series.

2. A method according to claim 1, wherein said applying said light-heat beam includes moving the light-heat beam, relative to the solar battery element arrangement, while pressing said pair of flexible members by said pressing structure so that said conductive members on said flexible members are locally and continuously heated to weld together each of the electrode patterns and each of said conductive members, and to weld together both said end portions of said conductive members which have been in close contact with each other in said space adjacent said each solar battery element.

3. A method according to claim 2, wherein said pair of flexible members includes a pair of flexible films each having as said conductive member a conductive pattern covered with a solder layer.

4. A method according to claim 3, wherein said welding step includes irradiation by a YAG laser beam to heat the solder layer almost instantly and locally without adversely affecting the periphery of the heated area.

5. A method according to claim 2, wherein said light-heat beam is moved at a high speed along the longitudinal direction of said pair of flexible members.

6. A method according to claim 2, wherein the pressing structure is transparent to the light-heat beam.

7. A method according to claim 1, wherein said pressing structure is made of silica glass.

8. A method according to claim 1, wherein said applying a light-heat beam includes applying said beam such that the illuminated area does not exceed the lateral width of the flexible members.

9. A method according to claim 8, wherein the illuminated area is outside the focal point of the light-heat beam.

10. A method according to claim 1, wherein the welding together of each of said electrode patterns and each of said conductive members, and the welding together of both said end portions of said conductive members which have been in close contact with each other in the space between adjacent said each solar battery element, is performed substantially simultaneously.

11. A method according to claim 1, wherein said pressing structure comprises two members, for sandwiching said pair of flexible members, each of said two members having projected portions each respectively located at a position corresponding to the space between adjacent solar battery elements.

* * * * *